United States Patent [19]

Mostafazadeh et al.

[11] Patent Number: 5,663,593
[45] Date of Patent: Sep. 2, 1997

[54] BALL GRID ARRAY PACKAGE WITH LEAD FRAME

[75] Inventors: Shahram Mostafazadeh, Santa Clara; Joseph O. Smith, Morgan Hill, both of Calif.

[73] Assignee: National Semiconductor Corporation, Santa Clara, Calif.

[21] Appl. No.: 543,978

[22] Filed: Oct. 17, 1995

[51] Int. Cl.$^6$ ............................................. H01L 23/495
[52] U.S. Cl. ...................... 257/666; 257/676; 257/738; 257/778
[58] Field of Search ............................ 257/738, 676, 257/666, 778

[56] References Cited

U.S. PATENT DOCUMENTS

| | | | |
|---|---|---|---|
| 5,403,776 | 4/1995 | Tsuji et al. | 257/738 |
| 5,409,865 | 4/1995 | Karnezos | 257/738 |

FOREIGN PATENT DOCUMENTS 4-277636  10/1992  Japan .................... 257/676

Primary Examiner—Tom Thomas
Assistant Examiner—Roy Potter
Attorney, Agent, or Firm—Skjerven, Morrill, MacPherson, Franklin, & Friel; Patrick T. Bever

[57] ABSTRACT

A ball grid array (BGA) package incorporates a lead frame which includes a die attach pad and a plurality of leads radiating away from the die attach pad. A die is mounted on the die attach pad and electrically connected to the leads by wire bonding. A non-conductive solder mask or tape is applied to the lead frame which defines a number of selectively positioned vias (openings). A molded plastic casing or a cap is positioned over the die, wiring and lead frame to encapsulate the package. Solder balls or columns are attached to selected leads of the lead frame through the vias.

8 Claims, 4 Drawing Sheets

BALL GRID ARRAY PACKAGE WITH LEAD FRAME

FIELD OF THE INVENTION

This invention relates to integrated circuit packages and in particular to ball grid array (BGA) packages.

BACKGROUND OF THE INVENTION

Several surface mounted package types are currently in use, including plastic leaded chip carriers (PLCC), plastic quad flat packs, small outline packages and ball grid array (BGA) packages. Each package type supports an IC chip, or "die", and provides interconnections between the die and a printed circuit board (PCB).

FIG. 1 shows an example of a typical molded IC package 10. Lead frame 20 is the central supporting structure of the molded IC package to which all other elements of the molded IC package 10 are attached. Lead frame 20 is etched or stamped from a thin sheet metal strip to form a pattern of narrow leads 22 that radiate from a central die attach platform 24 upon which a die 30 is mounted using, for example, an epoxy resin. Die 30 includes die bond pads 32 which are electrically connected to the radiating leads 22 of the frame by fine-diameter gold wires 40 using well-established wire bond techniques. The assembly including lead frame 20, die 30 and wires 40 are covered with a thermoset plastic casing 45 in an operation called transfer molding. After transfer molding, leads 22 of lead frame 20 are plated, trimmed and formed to complete the molded IC package 10.

As indicated in FIG. 1, a problem with molded IC package 10 is that a distance D between the ends of leads 24 is greater than a length L of plastic casing 45. As such, the printed circuit board (PCB) area taken up by molded IC packages 10 (the package "footprint") includes an apron area which extends around the perimeter of plastic package 45. When several molded IC packages are mounted onto a PCB, the collective apron areas of the mounted IC packages take up a significant amount of PCB space, and prevent a close spacing between the packages. This presents a problem for many applications where it is desirable to minimize the size of the PCB so that it may fit in a small space.

Ball grid array (BGA) packages were developed in part to overcome the spacing problems associated with molded IC packages.

FIG. 2 shows an example of a conventional BGA package 50. A die 60 is attached to the upper surface of substrate 70 using epoxy. Die 60 includes die bond pads 61 which are electrically connected to inner leads 71 of substrate 70 by wires 80 using known wire bond techniques. Substrate 70 includes a plurality of conductive patterns and vias formed in a laminated structure to form electrical connections between inner leads 71 and a set of outer leads (not shown) which are formed on a lower surface of substrate 70. After wires 80 are attached, substrate 70 is overmolded by plastic material 90. BGA package 50 is thereafter mounted onto a host PCB (not shown) using, for example, solder balls 95 which electrically connect outer leads of substrate 70 to electrical connections formed on the host PCB.

Because BGA package 50 is connected to a host PCB using solder balls 95 which are located under substrate 70, the "footprint" of BGA package 50 is substantially the same as the area of substrate 70. This small "footprint" allows close spacing between BGA packages on a PCB, thereby allowing BGA packages to be mounted on smaller PCBs when compared with molded IC packages (discussed above).

However, a problem with BGA packages is that substrates 70 are expensive to produce.

What is needed is a way to formulate a package having the small "footprint" of a BGA package and the low cost of a molded IC package.

SUMMARY OF THE INVENTION

In accordance with the present invention, a ball grid array (BGA) package is provided which incorporates a lead frame structure in place of a substrate, thereby reducing the cost while maintaining the beneficial small "footprint" commonly associated with BGA packages.

The lead frame of the BGA package includes a die attach pad and a plurality of leads radiating away from the die attach pad. A die is mounted on the die attach pad and electrically connected to the leads by wire bonding. A non-conductive solder mask or tape is formed/attached to the lead frame which defines a number of selectively positioned vias (openings). A molded plastic casing or a cap (ceramic, plastic or metal) is positioned over the die, wiring and lead frame to encapsulate the package. Solder balls or columns are attached to selected leads of the lead frame through the vias.

BRIEF DESCRIPTION OF THE DRAWINGS

These and other features, aspects, and advantages of the present invention will become better understood with the following description, appended claims, and accompanying drawings where:

DETAILED DESCRIPTION OF THE PREFERRED EMBODIMENTS

Figure 7:
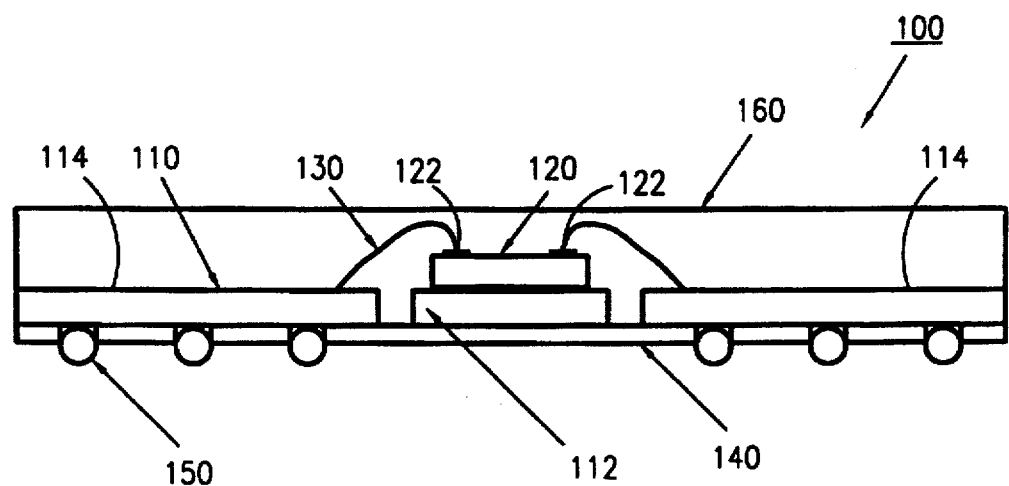
FIG. 7 is a section view of a BGA package in accordance with the present invention.

FIG. 7 shows a section view of a ball grid array (BGA) package 100 incorporating a lead frame in accordance with the present invention.

Referring to FIG. 7, BGA package 100 incorporates a lead frame 110 including a die attach pad 112 and a plurality of leads 114 extending radially from die attach pad 112. A non-conductive, heat resistant solder mask (coating) 140 is deposited on a lower surface of lead frame 110. Solder mask 140 is etched using a photolithographic process to define vias (openings) which expose selected portions of leads 114. An integrated circuit chip (die) 120 is mounted on die attach pad 112 using epoxy. A plurality of die bonding pads 122, which are electrically connected to the integrated circuit fabricated in die 120, are electrically connected to selected leads 114 by wires 130 using known wire bond techniques. A casing 160 is placed or formed over lead frame 110, die 120 and wires 130 for protection. Finally, solder balls 150 are attached to leads 114 of the lead frame 110 through the vias formed in the solder mask 140.

The above-described BGA package in accordance with the present invention incorporates an inexpensive wire frame 114, thereby obviating the need for the expensive substrate used in conventional BGA packages. This produces a package having the characteristic small "footprint" commonly associated with BGA packages, while substantially reducing packaging costs.

FIGS. 3–6 show a method for producing the BGA package in accordance with the present invention.

Figure 1:
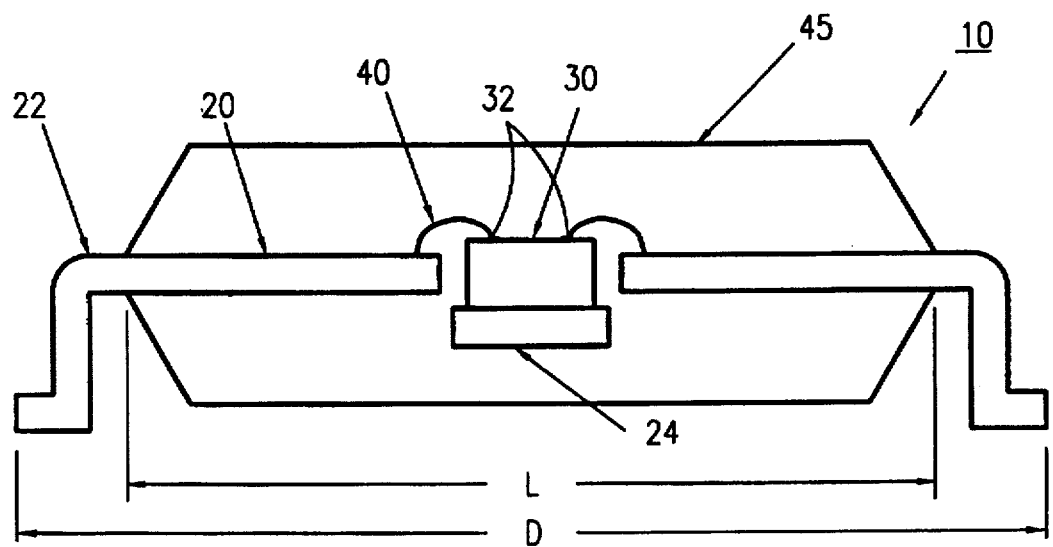
FIG. 1 is a section view of a conventional molded IC package.
Figure 2:
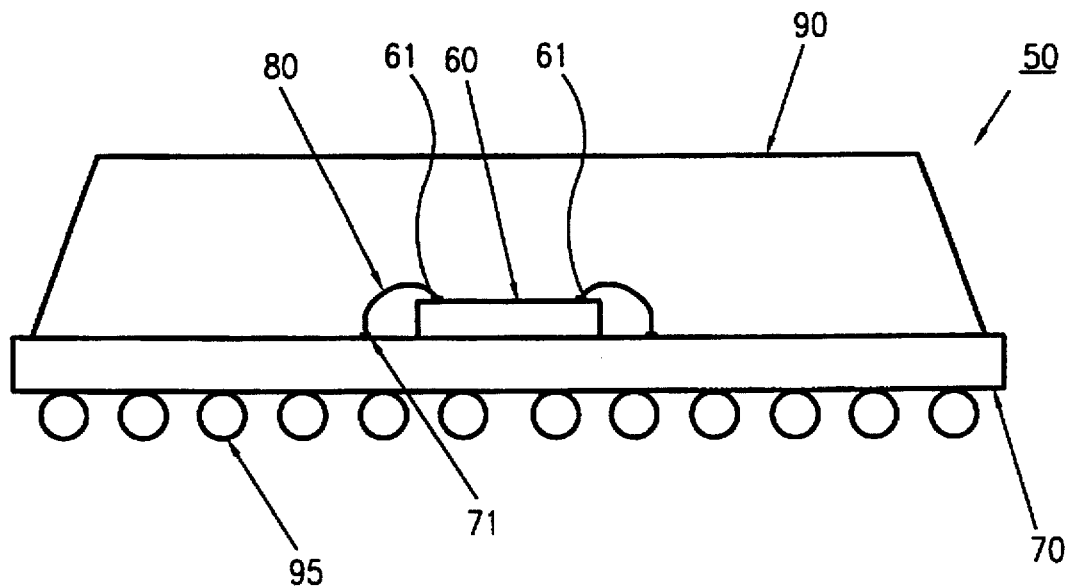
FIG. 2 is a section view of a conventional BGA package.
Figure 3A:
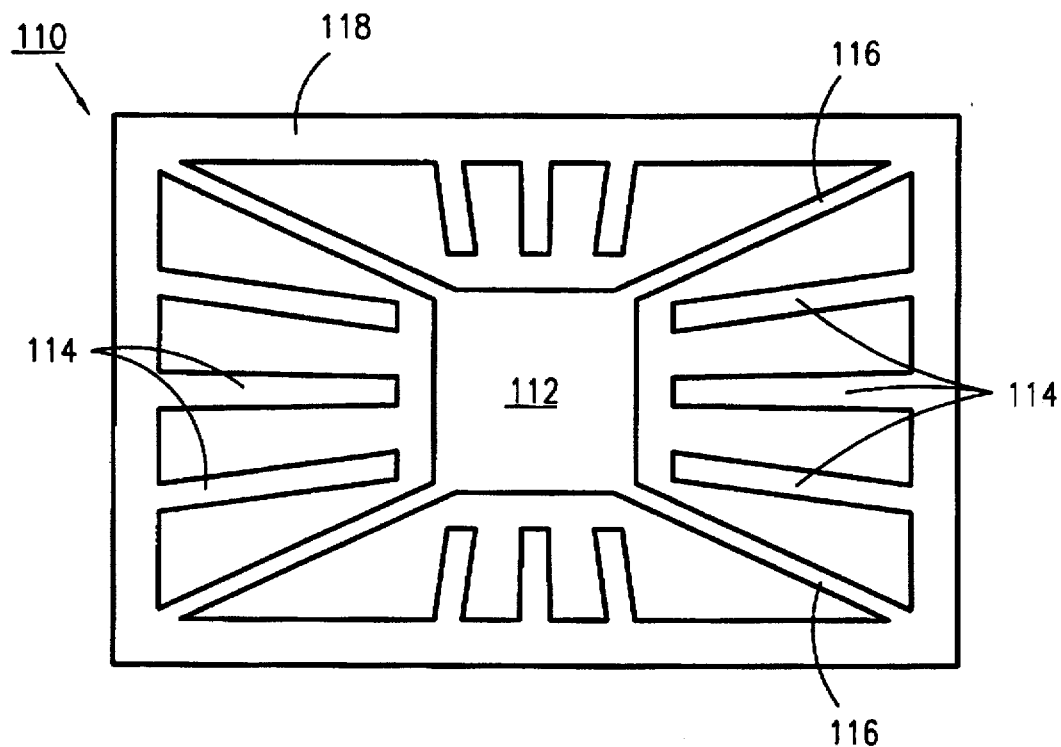
FIGS. 3A and 3B are top and section side views of a lead frame in accordance with an embodiment of the present invention.
Figure 3B:
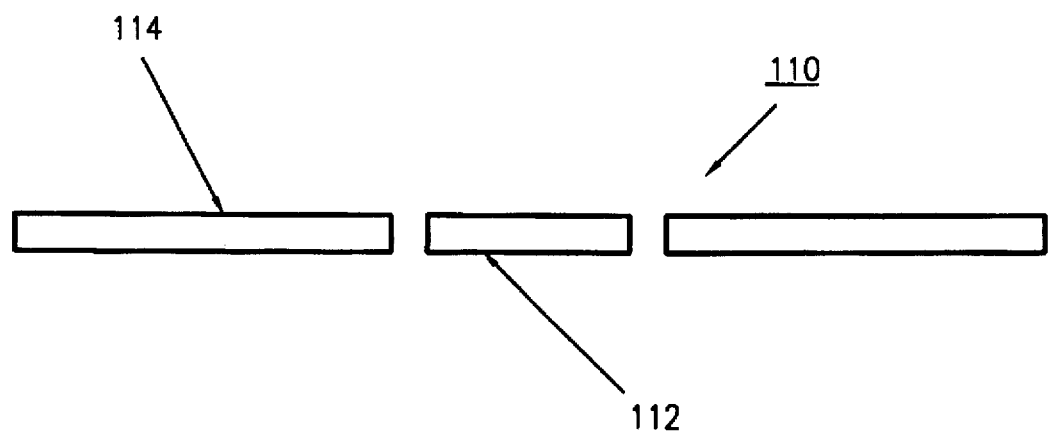

Referring to FIGS. 3A and 3B, a thin metal strip, such as copper, is etched or stamped to produce lead frame 110, which includes a centrally located die attach pad 112, radially extending leads 114 and tie bars 116. Leads 114 and tie bars 116 are rigidly maintained by a skirt 118, which is removed as described below. It is noted that the lead frame 110 shown in FIG. 3A is simplified for clarity. A lead frame used in an actual package may have a different shape than that shown, and includes many more leads.

Figure 4A:
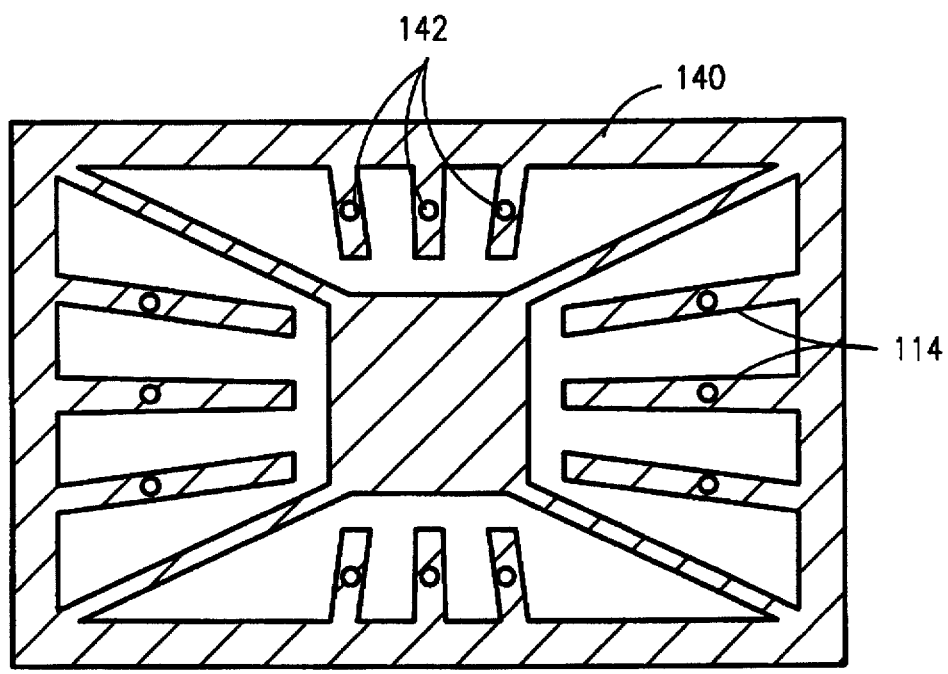
FIGS. 4A and 4B are top and section side views of the lead frame of FIGS. 3A and 3B including a solder mask.
Figure 4B:
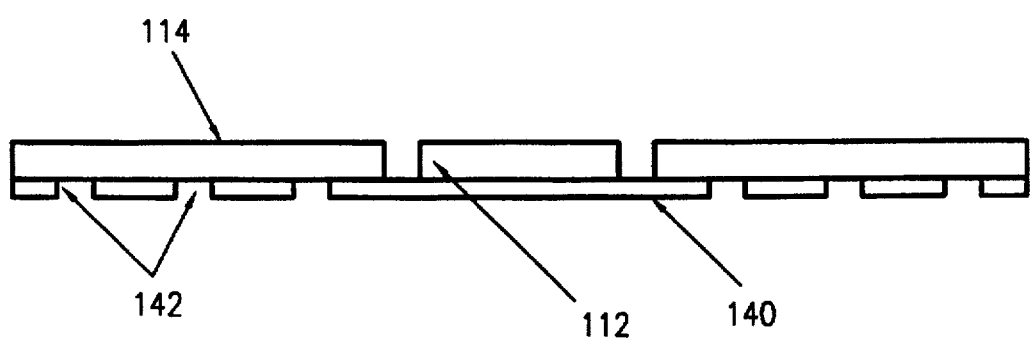

Referring to FIGS. 4A and 4B, a non-conductive solder mask 140 is deposited on lead frame 110 and etched to define a plurality of vias (openings) 142. Vias 142 are aligned with selective leads 114. In an alternative embodiment a polyamide tape defining vias 142 may be placed on lead frame 110.

Figure 5:
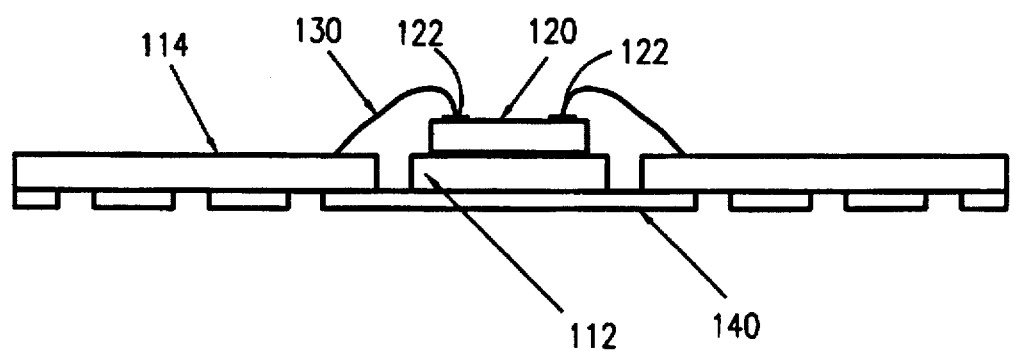
FIG. 5 is a section view showing a die attached to the masked lead frame of FIGS. 4A and 4B.

Referring to FIG. 5, die 120 is then mounted to die attach pad 112 using commonly known methods and adhesives. Wires 130 are then formed between die bonding pads 122 and leads 114 using known wire bond techniques.

Figure 6:
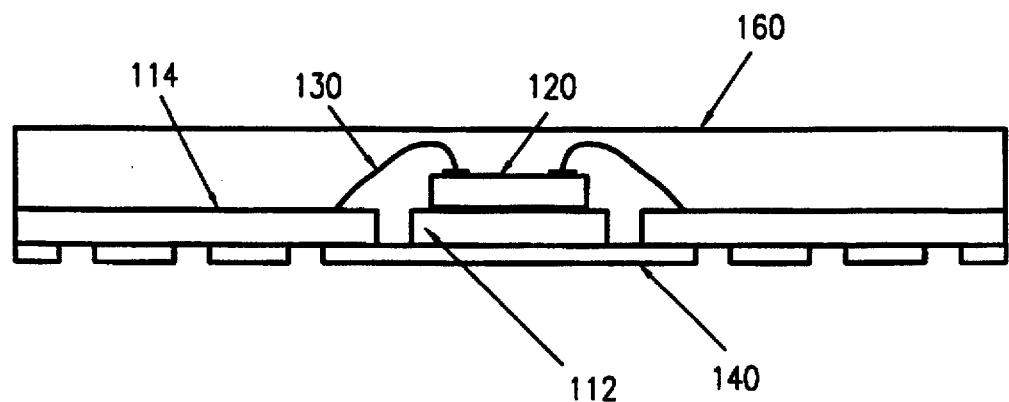
FIG. 6 is a section view showing encapsulation of the assembly of FIG. 5.

Referring to FIG. 6, casing 160 is formed over lead frame 110, die 120 and wires 130 using known plastic molding methods. Alternatively, a cap made of ceramic, plastic or metal is secured to lead frame 110 over die 120 and wires 130. After encapsulation, skirt 118 is removed by trimming.

Finally, as shown in FIG. 7, solder balls or columns 150 are attached to leads 110 through vias 142 using known methods.

While particular embodiments of the present invention have been shown and described, it will be obvious to those skilled in the art that changes and modifications may be made without departing from this invention in its broader aspects. For example, the lead frame may have any known configuration, and is not intended to be limited to the construction of lead frame 110 shown in FIGS. 3A and 3B. Further, solder balls 150 may be replaced with solder columns or pins. Therefore, the appended claims are to encompass within their scope all such changes and modifications as fall within the true spirit and scope of this invention.

What is claimed is:

1. An electrical device comprising:
   a flat lead frame including:
      a centrally-located die attach pad,
      a plurality of elongated leads which are electrically isolated from the die attach pad and extend in a radial direction away from the die attach pad, and
      a tie bar attached to the die attach pad and extending in a radial direction away from the die attach pad, the tie bar being positioned between two of the plurality of leads,
   wherein the die attach pad, the plurality of elongated leads and the tie bar are located in a common plane, and
   wherein the lead frame has opposing first and second surfaces;
   an integrated circuit chip mounted on the die attach pad on the first surface of the lead frame, the integrated circuit chip including a plurality of die bond pads;
   a non-conductive coating formed on the second surface of the lead frame, the non-conductive coating defining a plurality of openings exposing selected portions the plurality of leads; and
   a plurality of conductors, each of the plurality of conductors being electrically connected through one of the openings in the non-conductive coating to one of the plurality of leads;
   wherein each of the die bond pads is electrically connected with a selected one of the plurality of leads; and
   wherein the non-conductive coating is a solder mask.

2. The electrical device of claim 1, further comprising a plurality of wires, each of the plurality of wires connecting one of the die bond pads with a selected one of the plurality of leads.

3. The electrical device of claim 1, further comprising a cover formed over the first surface of the lead frame.

4. The electrical device of claim 3, wherein the cover comprises molded plastic.

5. The electrical device of claim 3, wherein the cover comprises a cap.

6. The electrical device of claim 1, wherein the conductors are solder balls.

7. The electrical device of claim 1, wherein the conductors are solder columns.

8. An electrical device comprising:
   a flat lead frame formed from a single metal sheet, the lead frame including:
      a die attach pad,
      a plurality of elongated leads which are electrically isolated from the die attach pad, and
      a tie bar attached to the die attach pad,
   wherein the lead frame has opposing first and second surfaces;
   an integrated circuit chip mounted on the die attach pad on the first surface of the lead frame, the integrated circuit chip including a plurality of die bond pads;
   a solder mask deposited on the second surface of the lead frame, the solder mask defining a plurality of openings exposing selected portions the plurality of leads;
   a plurality of conductors, each of the plurality of conductors being electrically connected through one of the openings in the solder mask to one of the plurality of leads; and
   a plurality of wires, each of the plurality of wires connecting one of the die bond pads with a selected one of the plurality of leads.

* * * * *